(12) United States Patent
Downing et al.

(10) Patent No.: US 7,376,165 B2
(45) Date of Patent: May 20, 2008

(54) LASER DIODE ALIGNMENT AND PACKAGING SYSTEM FOR INTEGRATED OPTICAL AND DISPLAY SUBASSEMBLIES

(75) Inventors: Elizabeth Downing, Sunnyvale, CA (US); Juergen Bruegl, Los Altos, CA (US)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 312 days.

(21) Appl. No.: 10/948,757

(22) Filed: Sep. 24, 2004

(65) Prior Publication Data

US 2005/0169337 A1 Aug. 4, 2005

Related U.S. Application Data

(63) Continuation of application No. 10/767,199, filed on Jan. 30, 2004, now abandoned.

(51) Int. Cl.
*H01S 5/00* (2006.01)
(52) U.S. Cl. .................. 372/50.12; 372/50.121
(58) Field of Classification Search .......... 372/9, 372/50.1, 50.121; 385/24, 96
See application file for complete search history.

(56) References Cited

U.S. PATENT DOCUMENTS

| | | | | |
|---|---|---|---|---|
| 3,896,473 A | | 7/1975 | DiLorenzo et al. | |
| 5,237,578 A | * | 8/1993 | Amano | 372/22 |
| 5,265,115 A | * | 11/1993 | Amano | 372/75 |
| 5,430,748 A | | 7/1995 | MacCormack et al. | |
| 5,568,498 A | * | 10/1996 | Nilsson | 372/43.01 |
| 5,914,976 A | | 6/1999 | Jayaraman et al. | |
| 6,081,636 A | * | 6/2000 | Kinoshita | 385/24 |
| 6,201,824 B1 | | 3/2001 | Hong et al. | |
| 6,636,339 B2 | | 10/2003 | Lee | |
| 2002/0122454 A1 | | 9/2002 | Nasu et al. | |
| 2003/0058911 A1 | * | 3/2003 | Ebeling | 372/50 |

FOREIGN PATENT DOCUMENTS

JP 58-196834 11/1983

OTHER PUBLICATIONS

European Search Report for European Patent Application No. 05001783.9-1226 dated Aug. 22, 2007.

* cited by examiner

*Primary Examiner*—Minsun Oh Harvey
*Assistant Examiner*—Tuan N. Nguyen
(74) *Attorney, Agent, or Firm*—Crowell & Moring LLP

(57) ABSTRACT

An apparatus and method for optically aligning output beams from multiple, individual, different-wavelength laser diodes. The output of a first laser diode is fed directly into the high-reflector of a laser diode, through the gain medium, and is output from an output coupler in each of a sequence of abutting laser diodes. The output from the last laser diode includes the individual beams from each laser diode in the same single optical axis, while retaining the original wavelengths.

31 Claims, 4 Drawing Sheets

LASER DIODE ALIGNMENT AND PACKAGING SYSTEM FOR INTEGRATED OPTICAL AND DISPLAY SUBASSEMBLIES

CROSS-REFERENCE TO RELATED APPLICATION

This application is a continuation-in-part of U.S. application Ser. No. 10/767,199, filed on Jan. 30, 2004 now abandoned.

BACKGROUND AND SUMMARY OF THE INVENTION

The present invention concerns an apparatus and method for aligning a plurality of laser beams, having different wavelengths, along a single optical axis. The invention also concerns a means for dynamically deflecting this superimposed set of beams with a scanning device. The invention also concerns the use of the aligned laser assembly and scanner in displays and display subsystems, including displays that use visible lasers, displays that use UV lasers to induce Stokes fluorescence, upconversion displays that use IR lasers, and combinations thereof.

The alignment and superposition of multiple individual laser beams along a single optical path can provide a number of advantages in a laser subassembly. These advantages include reducing the overall subassembly size; being able to use a single set of optical elements for focusing, modulation, scanning, etc.; and providing a means of delivering multiple lasers simultaneously to a designated target for increased power, multi-color display applications, laser alignment, and others. However, there are significant disadvantages to the presently available systems for accomplishing the optical alignment of multiple lasers along the same optical path. One such prior art system and method for aligning multiple lasers along the same optical path is illustrated in FIG. 1. In FIG. 1 the single optical axis formed from the three separate but aligned lasers, requires the use of two optical elements 10 and 11. During the manufacture of such an optical subassembly, these glass and/or plastic optical elements must be integrated, aligned, and permanently fixed in place. This is not only time consuming but difficult, and tends to have limited long term alignment stability. For example, in addition to the initial alignment problems and the associated cost of the components and labor, the glue used to hold these elements in place is subject to long term thermally induced polymer creep resulting in eventual misalignment. Furthermore, as more elements are added for each additional laser, and the number of refractive or reflective surfaces increases, alignment errors stack up during the manufacturing process.

Typical packaging of an individual laser diode involves soldering of the diode onto an electrically conductive, gold coated heat sink. The diode itself has a back facet known as the High Reflector (HR) and a front facet known as the Output Coupler (OC), both of which are optically coated to reflect the desired emission wavelength of the gain medium's susceptibility curve. A diode shown in FIG. 2 may be soldered onto a small heat sink. Additionally, the device of FIG. 2 may be encased in hermetic packaging to provide additional product life. Each individual packaged laser emits a predominant small set of wavelengths along an optical axis as a function of the output parameters of the laser including temperature and current. This is, by definition, the laser beam which can have multiple spatial modes and frequency components. In FIG. 3, a multiplicity of laser diodes are shown aligned in a row on a single heat sink, with all diodes emitting in the same direction, providing either synchronous or individual addressability via discrete modulation of current to the anodes. Such devices emit light in the same direction but along a plurality of parallel optical axis. In order to direct the output emission from different individually packaged lasers, or from an array of lasers as shown in FIG. 2, so that the light is coincident along the same optical axis, additional components such as prisms, gratings and other optical elements must be integrated into the path. This obviously increases the complexity and the cost of any such system or subassembly.

An object of the present invention is to provide improved multiple laser beam alignment arrangements having not only improved alignment of laser diode outlet beams but also an improved packaging arrangement. Another object of this invention is to provide a single optical beam from a combined set of individual lasers, which can be deflected by a single scanner assembly. Another object of this invention is to provide a laser-scanner subassembly that can be used as a projection display embodying visible lasers, UV lasers, IR lasers and combinations thereof.

It is a further object of this invention to provide a projection display comprising an aligned set of lasers, an optical scanner, and a viewing screen for automobiles, public spaces, advertisements, and other applications.

In accordance with the objects of the present invention, a plurality of optic beams from multiple individual different wavelength lasers are combined without the need for additional prisms, gratings or other combining elements. The combined beams are deflected with a single optical scanner system onto a screen for viewing of displayed information.

According to the present invention, this is accomplished by arranging a plurality of laser diodes one behind the other such that their respective optical axes are coincident. Permanent fixturing of the lasers in this configuration is accomplished by soldering the chips onto the heat sink. No glue is used, thereby eliminating the problems of creep that are associated with polymer adhesives. The light from any one laser propagates through the laser diode chip that is directly in front of it, so long as the devices are positioned within a maximum proximity to each other. Laser diodes of different wavelengths will propagate through the narrow band reflective coatings on the facets of other lasers because the interference layers are very selective. No stimulation of laser action, and only minimal stimulated fluorescence occurs between the sequentially packaged lasers, as the index profile of the devices confines light of multiple wavelengths forcing it to propagate through, and the narrow band facet coatings only allow gain to build up at specific wavelengths. The packaging of lasers directly behind one another for purposes of stimulating laser action between sequentially packaged lasers is known, for example, from a Master-Oscillator Power-Amplifier (MOPA) shown in FIG. 7. A single Fabre-Perot device (oscillator) is packaged directly behind another laser diode (amplifier). The second laser diode is longer than the first in order to provide more gain and is not coated with reflective layers so that it does not have the High Reflector-HR or the Output Coupler (OC) properties of an oscillator. The amplifier in such a device may in fact have anti-reflective coatings to suppress back reflection of the seed emission from the oscillator. Anti-reflection coatings, in conjunction with HR and OC coatings can be applied to increase the through put efficiency of this invention as well. Light from the oscillator of FIG. 4 seeds the amplifier chip, pulling massive gain out of the second device in a single pass (no oscillation). These devices were developed to enable high speed modulation of high power by modulating the low current to the oscillator. The present invention differs from the MOPA architecture in that the output of one laser is not used to stimulate gain of the same wavelength in an amplifier. Instead, the present invention provides a single optical axis for a plurality of different wavelengths.

Deflective scanning of the combined beams may be accomplished by directing them through an acceptable optical scanning system. This architecture could involve several discrete optical elements including lenses, mirrors, and fibers. The use of fibers enables the packaged laser subassembly to be physically removed from the scanner by a greater distance than it could normally be, and it also forces all of the output beams to exit with a circular profile and nearly the same numerical aperture. In addition, the fiber can be used to spatially filter out higher order spatial modes of the beams. The display of information is accomplished by scanning the combined beams and appropriately modulating the current as they traverse through the various pixels on an appropriate screen. A screen can be white or some light color, possibly with light management features integrated to enhance- or directionally control the reflectivity for increased brightness. Additionally, the screen can contain a mixture of Stokes or upconversion phosphors, which respond to scanned UV or IR light by emitting visible light. Such upconversion can be a single frequency upconversion or a gated-two frequency upconversion. Gray scale can be achieved by modulating the power output of each laser at every pixel which is done by modulating the drive current. Color mixing is then accomplished by controlling how much of each color is addressed at each pixel. Thus a multi-color RGB projection display can be achieved. Such displays have tremendous utility in automobiles, particularly on dashboards and headrests where curved surfaces exist or where it is difficult or impossible to have electrical wires. Additionally, since laser diodes are small and easy to thermally control using thermistors and Peltier thermal electric coolers, such a display has substantially higher environmental tolerances than existing display technologies for automobiles.

Other objects, advantages and novel features of the present invention will become apparent from the following detailed description of the invention when considered in conjunction with the accompanying drawings.

DETAILED DESCRIPTION OF THE PREFERRED EMBODIMENTS

Figure 1:
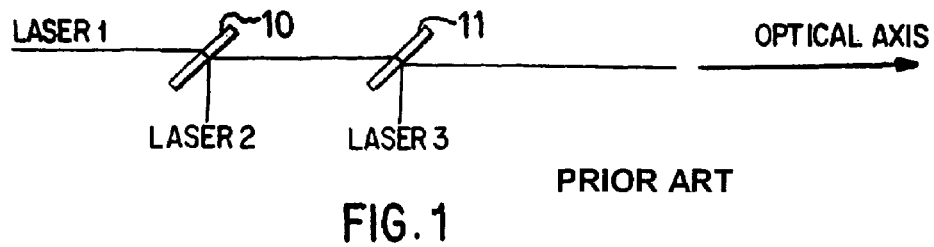
FIG. 1 illustrates a prior art method for aligning multiple lasers along a single optical path.
Figure 2:
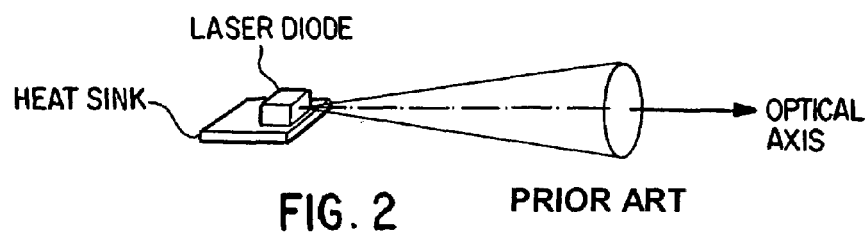
FIG. 2 is an arrangement of a single laser diode mounted on a heat sink.
Figure 3:
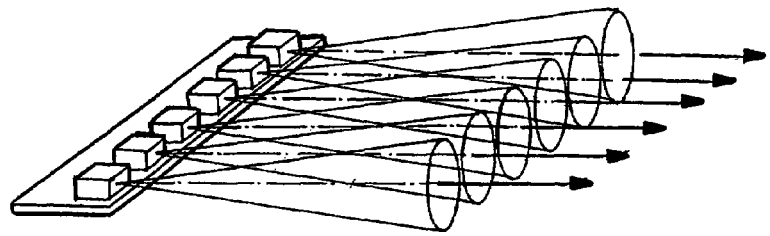
FIG. 3 is a schematic of an array of laser diodes mounted in parallel.
Figure 4:
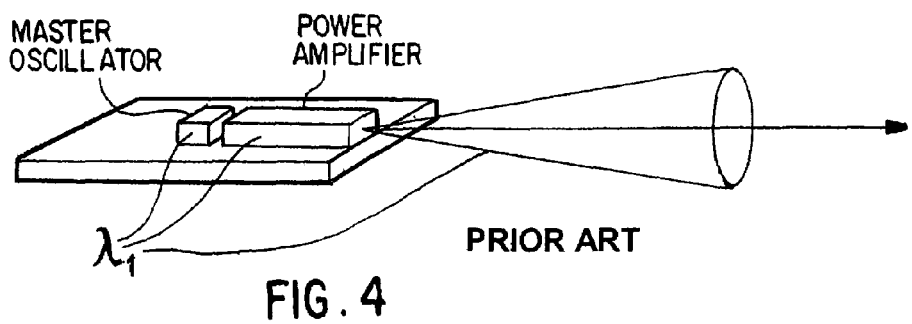
FIG. 4 is a prior art diode structure for amplifying a single wavelength.
Figure 5A:
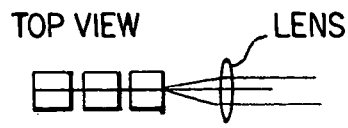
FIGS. 5a and 5b show an axial array of laser diodes mounted on a heat sink according to the present invention.
Figure 5B:
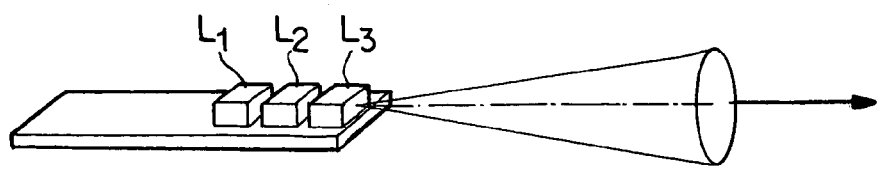

The optical alignment of output beams from multiple individual different-wavelength laser diodes L1, L2 and L3 is shown in FIGS. 5A and 5B. Light output from first laser diode L1 passes directly into the high reflector (HR) of a second laser diode L2 through the gain medium and out from the Output Coupler (OC). Additionally, the emission of the second laser L2 is also output from the OC of the second laser. The coincident beams of lasers L1 and L2 are then directed into the High-Reflector (HR) and out from the Output Coupler (OC) of an additional laser diode L3 in a sequential fashion. The light from the Output Coupler of laser diode L3 thus includes superimposed beams from all three lasers (L1, L2, L3), which are aligned on a single optical axis. Light will propagate through the entire structure in a manner similar to that in which light passes through an optical fiber provided that individual laser diodes L1-L3 are directly adjacent to each other or separated by a very small distance. The beam from L1 passes directly through L2 and L3 and the beam from L2 passes directly through L3 along with the light beam emitted from L3. Therefore, all beams exit from the Output Coupler of the final diode L3, having diffraction properties of the final exit aperture yet retaining their original individual wavelengths. Thus, minor misalignments of the beams as they enter the subsequent lasers will be corrected by the confinement structure of the next diode.

The functioning of the different wavelength laser diodes to provide through put optical alignment of the output beams results from the close end-to-end positioning of the individual devices and from the mirror coatings which make up the HR (high-reflector) and the OC (output coupler) of the diode. These coatings have very narrow band reflectivity (typically less than 10 nm FWHM (Full Width Half Minimum)). The facet coatings are transparent outside of the particular narrow band region thereby allowing light of other wavelengths to pass directly through the diode structure without heating up the surfaces, without lasing or oscillating, without depleting gain, or without interfering with the internal mode structure. Additionally, the confinement structure of any sequential laser functions to prevent diffraction of any proceeding laser beam(s) until it exits from the output coupler (OC) of the last diode in the series. In this way, multiple lasers can be packaged on the same heat sink while being placed next to each other in a serial fashion in order to optically superimpose the outputs.

Figure 6:
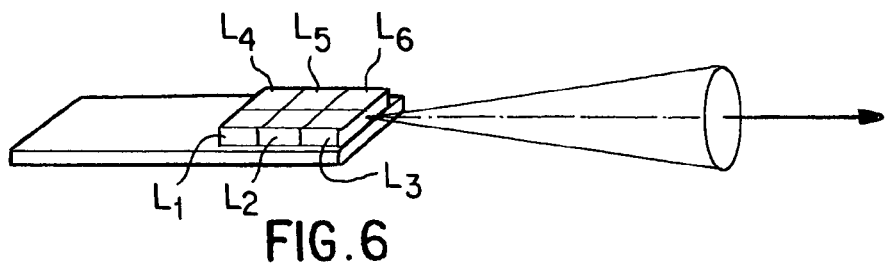
FIG. 6 illustrates an Li-L6 axial array according to the present invention using broad-beam emitters.
Figure 7:
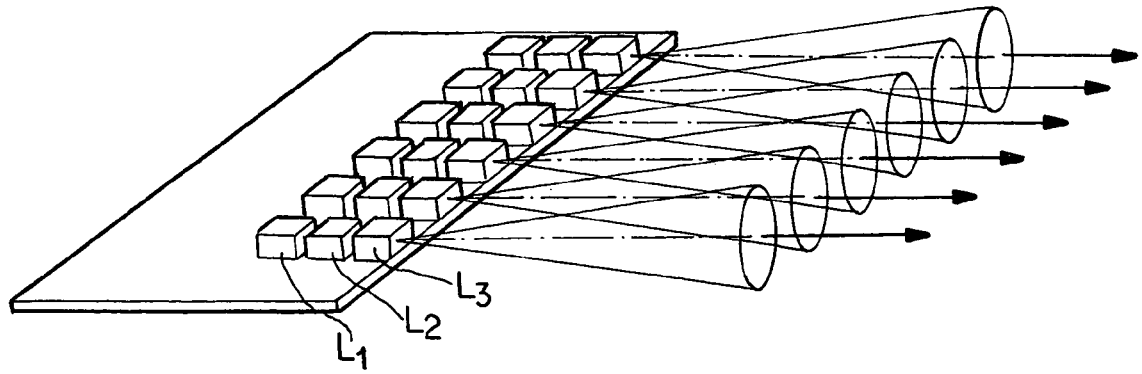
FIG. 7 details the application of the present invention to a parallel array of axially-aligned laser diodes mounted on a heat sink.

The alignment mechanism described above and shown in FIGS. 5A and 5B can be used on a variety of structures including, but not limited to, standard Fabre-Perot lasers, and broad-beam emitters as shown in FIG. 6. Furthermore, it is possible to construct arrays of such devices as shown in FIG. 7.

Figure 8:
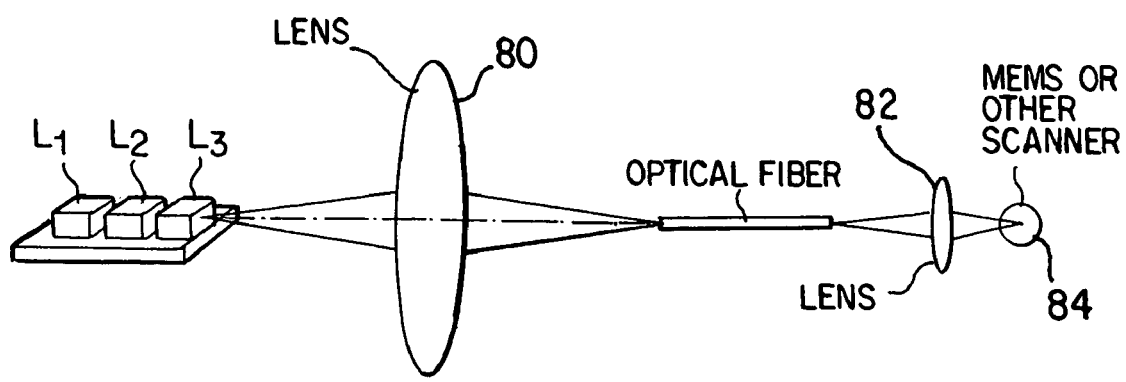
FIG. 8 illustrates scanning of an axial array of laser diodes into an optical fiber for a micro-electro-mechanical-system (MEMS) or other scanning device.

FIG. 8 illustrates axially aligned laser diodes according to the present invention coupled into an optical fiber through the lens 80 and from the fiber through lens 82 into a scanner 84. An optical system according to the present invention provides low-cost optical subassemblies for laser projection displays and up- or down-conversion displays which are designed for automobiles. The invention may also be used in telecommunication systems, laser printing, volumnmetric displays and other products that incorporate laser diodes of multiple, differing wavelengths.

Figure 9A:
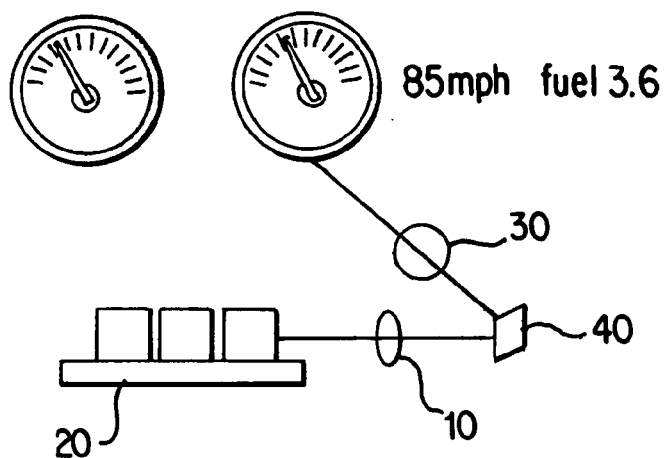
FIGS. 9a and 9b show an example of deflective scanning using the laser diode system of the present invention.
Figure 9B:
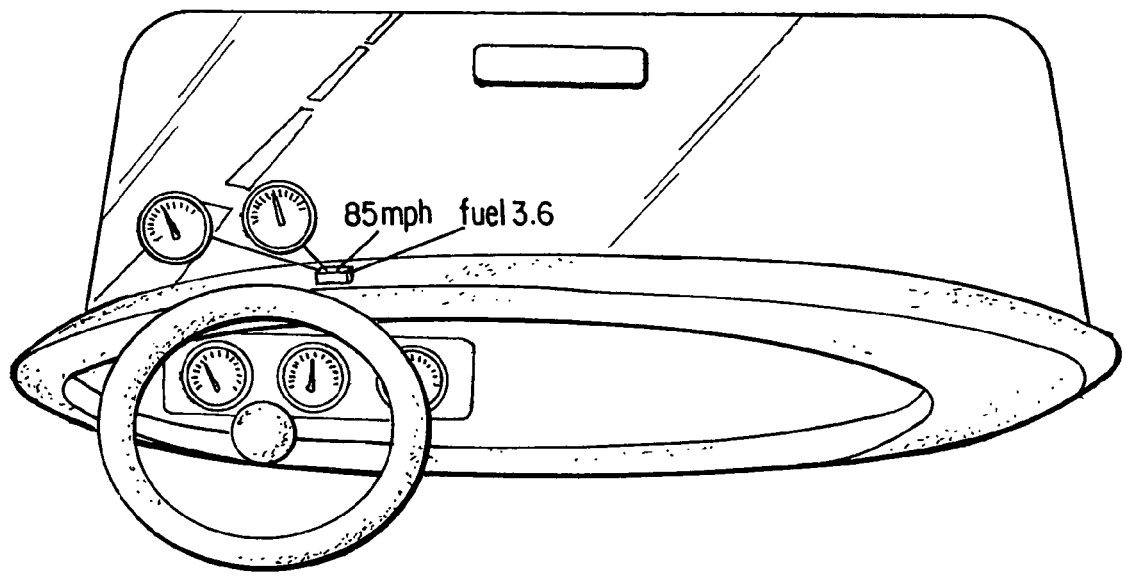

FIGS. 9a and 9b illustrate axially aligned laser diodes according to the present invention which are coupled into a deflective scanning system and projected to form a display. Lens system 10 is used to focus the light from the aligned lasers 20 into the scanner aperture 40, and lens system 30 is used to provide post scanner beam control. Appropriate scanners for this implementation include mechanical scanners, galvanometer scanners, MEMs scanners, polygon scanners, acousto-optic modulators, and others. Modulation control of the individual lasers while they are being scanned across the screen enables multi-colored visual information and text to be addressed at >30 Hz refresh rates.

The simplicity of the invention, and the ability for it to be implemented during the packaging of the lasers are just a few of the several advantages the present invention offers over existing methods of optically aligning multiple laser beams. It is not only cost effective but can also be used to align different wavelengths of laser diodes into a single device architecture, which is needed for MEMS (micro-electro-mechanical-system) projection display technology used in automobiles and other areas such as advertising, consumer electronics and telecommunication.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A laser diode system for propagating multiple laser beams of different wavelengths along the same optical axis, the system comprising:
    at least two broad-beam emitter laser diodes; and
    a laser support structure disposed in contact with each of said at least two laser diodes and configured to support each of said at least two laser diodes in a substantial abutting relationship, wherein each of said at least two laser diodes outputs a wavelength different from any other one of said at least two laser diodes and wherein an output of one of said at least two laser diodes provides a laser output containing beams from each of said at least two laser diodes, said contained beams retaining their original wavelengths and being aligned in the same optical axis,
    wherein each of said at least two laser diodes includes a first reflective coating on a back facet and a second reflective coating on a front facet; and
    wherein the first and second reflective coatings of the front facet and the rear facet provide very narrow band reflectivity with said coatings being transparent outside of said narrow band thereby allowing light of wavelengths outside said narrow band to pass directly through the at least two laser diodes.

2. The system according to claim 1 wherein at least one of said at least two diodes outputs a visible wavelength.

3. The system according to claim 1 wherein at least one of said at least two diodes outputs an ultra-violet wavelength.

4. The system according to claim 1 wherein at least one of said at least two diodes outputs an infrared wavelength.

5. The system according to claim 1, wherein said laser support is a heat sink.

6. The system according to claim 1, wherein diffraction properties of each of said beams in said output are provided as a function of a final exit aperture of said one laser diode.

7. The system according to claim 1, wherein each of said at least two laser diodes are Fabre-Perot lasers.

8. The system according to claim 1, wherein the laser diodes have anti-reflection facet coatings at wavelengths outside of a lasing band of each laser diode.

9. A method for aligning multiple laser beams along an optical axis, the method comprising the acts of:
    providing a plurality of broad-beam emitter laser diodes;
    coating a back facet and a front facet of each of said plurality of diodes;
    arranging said plurality of diodes in a substantially sequential relationship on a support structure that is disposed in contact with each of said plurality of diodes whereby a resulting laser output contains a laser beam output from each of said plurality of diodes and wherein each of said output laser beams is aligned in a same single optical axis,
    wherein said coated front and back facet of said plurality of diodes provides a narrow band reflectivity, which allows light of wavelengths outside said narrow band to pass directly through.

10. The method according to claim 9, further including fixing each of said laser diodes onto a heat sink.

11. The method according to claim 10, wherein fixing includes soldering the laser diodes to the heat sink.

12. The method according to claim 10, further including hermetically encasing said plurality of laser diodes on said heat sink.

13. The method according to claim 9, wherein the coating of the rear facet provides substantially 100% reflectivity of the laser wavelength and the coating of the front facet provides less than 100% reflectivity by design.

14. An optically aligned arrangement of laser diodes, comprising:
    a plurality of broad-beam emitter laser diodes, each of which outputs a different wavelength;
    a support device retaining said plurality of laser diodes in a series of back-to-back substantially abutting relationships, the support device being disposed in contact with each of said plurality of laser diodes, each of said plurality of laser diodes having front and back coated facets wherein one of said plurality of laser diodes outputs a plurality of laser beams, wherein each of said plurality of laser beams respectively corresponds to each of said plurality of laser diodes, and wherein each of said laser beams proceeds from said one laser diode in a single same optical axis; and
    a deflective scanner configured to receive the plurality of laser beams,
    wherein said output plurality of beams are modified with additional optical elements to appropriately shape said output beams for input into a deflective scanning system.

15. The arrangement according to claim 14, wherein the deflective scanner is at least one of a MEMS scanner, a mechanical scanner, a galvanometer scanner, a polygon scanner, and an acousto-optic modulator.

16. The arrangement according to claim 14, further comprising a viewing screen configured to display information received from the deflective scanner.

17. The arrangement according to claim 16, wherein said viewing screen is reflective of visible colors.

18. The arrangement according to claim 17, wherein said phosphor viewing screen is an upconversion phosphor viewing screen.

19. The arrangement according to claim 18 wherein said upconversion viewing screen functions with a single frequency upconversion.

20. The arrangement according to claim 18 wherein said upconversion viewing screen functions with a gated-two frequency upconversion.

21. The arrangement according to claim 16, wherein said viewing screen is a phosphor screen.

22. The arrangement according to claim 21, wherein said phosphor viewing screen is a Stokes fluorescent phosphor viewing screen.

23. The arrangements according to claim 14, wherein said optical elements are lenses.

24. The arrangement according to claim 14, wherein said output plurality of beams are additionally modified with post scanner optical elements to appropriately shape and correct the displayed information on the phosphor screen.

25. The arrangement according to claim 24, wherein the post scanner optical elements are lenses.

26. The arrangement according to claim 14, wherein said support device is a heat sink.

27. The arrangement according to claim 26, wherein said heat sink is integrated with a thermal electric Peltier cooler and a thermister for monitoring and maintaining the proper temperature of the device.

28. The arrangement according to claim 14, wherein said output beams provide an optical fiber input.

29. The arrangement according to claim 28, further including an optical fiber for receiving said optical fiber input and outputting a fiber output to a scanning device.

30. The arrangement according to claim 28, further including an optical fiber for receiving said optical fiber input and providing an output to a micro-electro-mechanical-system projection display device.

31. A display system, comprising:
a plurality of broad-beam emitter laser diodes, each of which outputs a different wavelength;
a support device retaining said plurality of laser diodes in a series of back-to-back substantially abutting relationships, the support device being disposed in contact with each of said plurality of laser diodes, wherein one of said plurality of laser diodes outputs a plurality of laser beams, wherein each of said plurality of laser beams respectively corresponds to each of said plurality of laser diodes, and wherein each of said laser beams proceeds from said one laser diode in a single same optical axis;
a first lens system configured to focus and output the plurality of laser beams;
a deflective scanner configured to receive the plurality of laser beams from the first lens system and output the plurality of laser beams; and
a second lens system configured to provide post scanner beam control for the plurality of laser beams output by the deflective scanner to form a display.

* * * * *